United States Patent
Low

(10) Patent No.: US 9,930,789 B2
(45) Date of Patent: Mar. 27, 2018

(54) FLEXIBLE PRINTED CIRCUIT CABLE WITH MULTI-LAYER INTERCONNECTION AND METHOD OF FORMING THE SAME

(75) Inventor: Chau-Chin Low, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 1749 days.

(21) Appl. No.: 12/758,555

(22) Filed: Apr. 12, 2010

(65) Prior Publication Data

US 2011/0247862 A1 Oct. 13, 2011

(51) Int. Cl.
*H05K 3/40* (2006.01)
*H05K 1/18* (2006.01)

(52) U.S. Cl.
CPC ......... *H05K 3/4038* (2013.01); *H05K 3/4053* (2013.01); *H05K 1/189* (2013.01); *H05K 2201/0305* (2013.01); *Y10T 29/49124* (2015.01)

(58) Field of Classification Search
CPC .. H05K 3/4038; H05K 3/4053; H05K 3/4084; H05K 1/189; H05K 2201/0305; Y10T 29/49124; Y10T 29/49155
USPC .......... 29/830, 831, 840, 846, 852; 257/698; 174/254, 262, 263; 361/778, 803; 439/69, 74, 430
See application file for complete search history.

(56) References Cited

U.S. PATENT DOCUMENTS

| | | |
|---|---|---|
| 3,866,307 A | 2/1975 | Pfahl, Jr. et al. |
| 4,115,601 A | 9/1978 | Ammann et al. |
| 4,567,543 A | 1/1986 | Miniet |
| 5,196,087 A | 3/1993 | Kerns |
| 6,163,957 A * | 12/2000 | Jiang et al. ............. 29/852 |
| 6,326,555 B1 * | 12/2001 | McCormack et al. ........ 174/255 |
| 6,373,000 B2 | 4/2002 | Nakamura et al. |
| 6,396,141 B2 * | 5/2002 | Schueller et al. ........... 257/706 |
| 6,426,240 B2 | 7/2002 | Isaak |
| 6,526,654 B1 | 3/2003 | Song et al. |
| 6,535,045 B1 | 3/2003 | Vangal |
| 6,655,643 B1 | 12/2003 | Hoyl et al. |
| 6,888,427 B2 | 5/2005 | Sinsheimer et al. |
| 6,889,432 B2 | 5/2005 | Naito et al. |
| 7,081,373 B2 | 7/2006 | Roeters et al. |
| 7,229,855 B2 | 6/2007 | Murphy |
| 7,251,099 B2 | 7/2007 | Kao et al. |
| 7,253,989 B1 | 8/2007 | Lau et al. |
| 7,281,327 B2 | 10/2007 | Takayoshi et al. |
| 7,291,907 B2 | 11/2007 | RaghuRam |
| 7,394,028 B2 | 7/2008 | Cohn |
| 7,425,135 B2 | 9/2008 | Liu et al. |
| 2005/0103524 A1 | 5/2005 | Naito et al. |
| 2005/0245118 A1 | 11/2005 | Liu et al. |
| 2006/0166526 A1 | 7/2006 | Lee et al. |
| 2006/0225914 A1 | 10/2006 | Tan |

(Continued)

*Primary Examiner* — Peter DungBa Vo
*Assistant Examiner* — Jeffrey T Carley
(74) *Attorney, Agent, or Firm* — Faegre Baker Daniels LLP

(57) ABSTRACT

The steps of forming a multi-layer flexible printed circuit cable (flex circuit) with an electrical interconnection between independent conductive layers. In accordance with various embodiments, a partial aperture is formed in the flex circuit that extends through a first conductive layer and an intervening insulative layer to an underlying surface of a second conductive layer that spans the partial aperture. A solder material is reflowed within the partial aperture to electrically interconnect the first and second conductive layers.

12 Claims, 5 Drawing Sheets

(56) References Cited

U.S. PATENT DOCUMENTS

| | | |
|---|---|---|
| 2006/0289986 A1 | 12/2006 | Sherman et al. |
| 2007/0066126 A1 | 3/2007 | Dutta et al. |
| 2007/0084823 A1 | 4/2007 | Hsu et al. |
| 2007/0096288 A1 | 5/2007 | Choi et al. |
| 2007/0103877 A1 | 5/2007 | Thomas et al. |
| 2007/0184688 A1 | 8/2007 | Avitia et al. |
| 2007/0194456 A1 | 8/2007 | Cohn |
| 2008/0047135 A1 | 2/2008 | Arnold |

* cited by examiner

FLEXIBLE PRINTED CIRCUIT CABLE WITH MULTI-LAYER INTERCONNECTION AND METHOD OF FORMING THE SAME

SUMMARY

Various embodiments of the present invention are generally directed to a flexible printed circuit cable with a multi-layer interconnection, and method for forming the same.

In accordance with various embodiments, a multi-sided flex circuit is provided with a first conductive layer on a first side of a flexible insulative layer and a second conductive layer on an opposing, second side of the insulative layer. A partial aperture is formed in the flex circuit by removing a portion of the insulative layer to expose a portion of the second conductive layer that spans said aperture. The first conductive layer and the exposed portion of the second conductive layer are then electrically interconnected by reflowing a solder material within said aperture.

These and other features and aspects which characterize various embodiments of the present invention can be understood in view of the following detailed discussion and the accompanying drawings.

DETAILED DESCRIPTION

The present disclosure generally relates to establishing an electrical interconnection between opposing layers of a multi-layer flexible printed circuit cable (flex circuit or PCC). Flex circuits can be used to provide conductive paths to transmit electrical signals, such as data signals and electrical power supply signals. Flex circuits are flexible and can be routed in a variety of ways between electrical devices.

Flex circuits are often designed to have low impedance characteristics in order to enhance signal transmission integrity, particularly in high speed communication applications. It is common to transmit signals along a pair of conductive pathways, such as copper traces, on opposing sides of an intervening insulative layer of the flex circuit. By using an insulative layer with a smaller thickness, the copper traces can be brought closer together, which generally operates to lower the operational impedance of the circuit.

It is sometimes desirable to electrically interconnect traces on opposing sides of a flex circuit. A via, or plated through hole, can be formed by plating the annular sidewall of a through-hole aperture in the insulative layer with conductive material. This provides an electrically conductive "column" that interconnects the respective traces on the top and bottom sides of the flex circuit.

While operable, via formation generally requires the insulative layer to be sufficiently thick to allow the aperture sidewall to be plated during the associated copper etching process. If a via is incorporated into a flex circuit, the thickness of the insulative layer, and hence, the separation distance between the traces, may be significantly greater than the optimal spacing needed to minimize impedance and signal mismatch levels.

Accordingly, various embodiments of the present invention are generally directed to establishing a low impedance interconnection between opposing layers of a multi-layer flex circuit. This can provide a number of benefits, such as the ability to use an insulative layer with a reduced thickness to provide improved impedance characteristics of the flex circuit.

Figure 1:
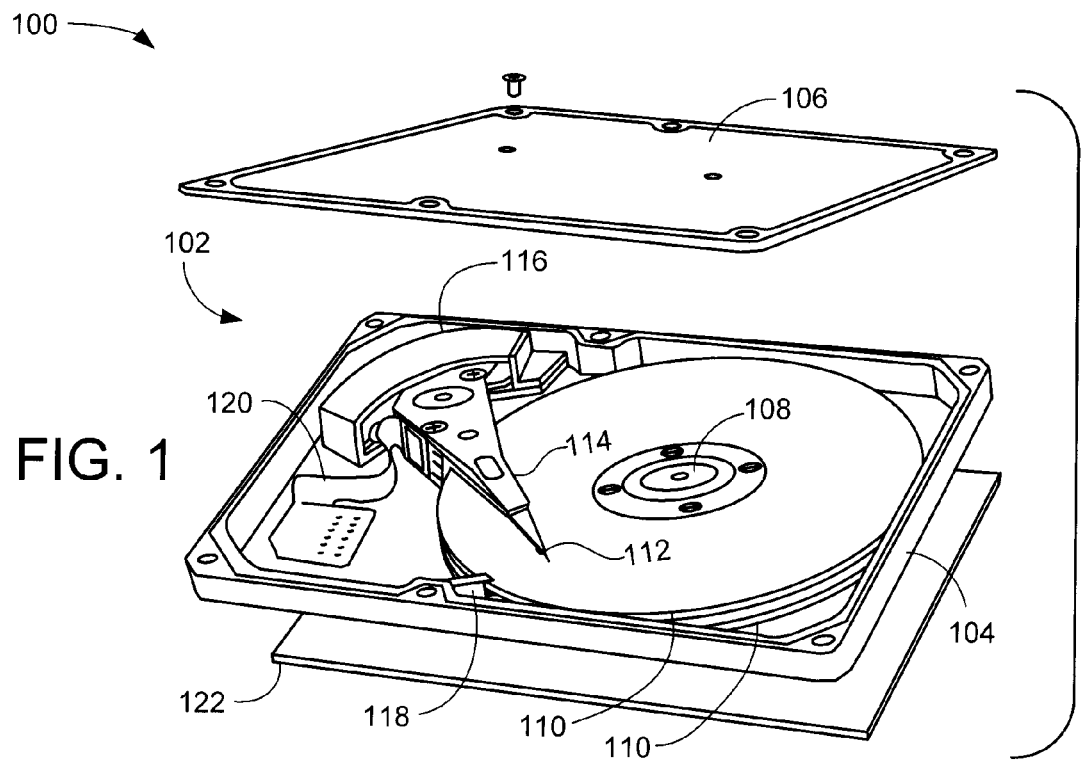
FIG. 1 provides an exploded view of an exemplary data storage device.

FIG. 1 provides an exploded view of a disc drive block data storage device 100. The drive 100 is provided to show an exemplary environment in which various embodiments of the present invention can be advantageously practiced. It will be understood that the claimed invention is not so limited.

A sealed housing 102 is formed from a base deck 104 and top cover 106. A spindle motor 108 supported within the housing rotates storage media 110 (discs) at a selected rotational velocity. An array of data transducers (heads) 112 are hydrodynamically supported adjacent the rotating media surfaces by fluidic currents established by the rotating media.

The heads 112 are controllably moved across the media surfaces by a rotary actuator 114. The actuator 114 pivots responsive to drive currents applied to a voice coil motor (VCM) 116. The heads 112 are parked (unloaded) onto a ramp structure 118 when the device 100 is deactivated.

A flexible printed circuit cable 120 (flex circuit or PCC) facilitates electrical communication between the actuator 114 and device control electronics on an externally disposed printed circuit board (PCB) 122. The flex circuit 120 provides a dynamic loop to maintain electrical interconnection between the actuator 114 and the PCB 122 over the full stroke range of the actuator.

Figure 2A:
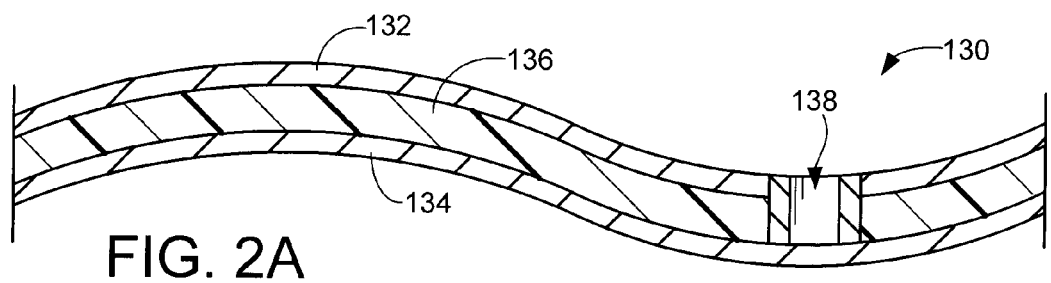
FIG. 2A shows a side elevational, cross-sectional representation of a multi-layer flexible printed circuit cable (flex circuit).

FIG. 2A provides a side elevational, cross-sectional representation of a flexible printed circuit cable 130 suitable for use in the device 100 of FIG. 1. The PCC 130 has opposing first and second conductive layers 132 and 134 separated by an intervening insulative layer 136. The PCC 130 can be manipulated and configured in a variety of ways due to the flexibility of the conductive and insulative layers.

The insulative layer 136 can be formed from a suitable thin flexible film such as polyester. The conductive layers 132, 134 can be formed as copper or other conductive metal traces. Although not shown in FIG. 2A, exterior protective layers of thin film material can be applied to electrically insulate and mechanically protect the traces. Additional layers of insulative and conductive material can be incorporated onto the PCC 130 as desired.

A via 138 provides an electrical interconnection between the upper and lower conductive layers 132, 134. The via 138 is formed by removing material from the insulative layer 136 to form a through-hole aperture with an annular sidewall, and depositing copper or other conductive material on the annular sidewall. The via may be formed during the same deposition process used to form the conductive layers, or can be formed during a different processing step. The insulative layer 136 is provided with sufficient thickness to support the formation of the via 138.

Figure 2B:
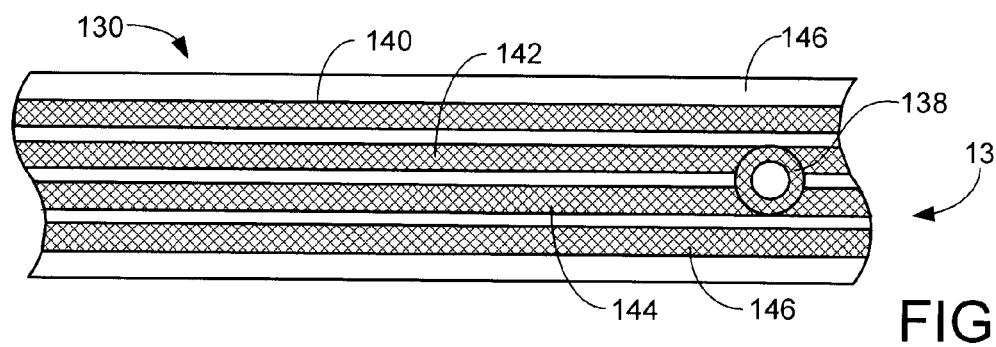
FIG. 2B is a top plan representation of the flex circuit of FIG. 2A.

FIG. 2B shows a top plan representation of the PCC 130 of FIG. 2A. The upper conductive layer 132 has four (4) adjacent conductive traces 140, 142, 144 and 146. The exemplary via 138 of FIG. 2A is shown to interconnect the traces 142 and 144 with one or more traces on the bottom side of the insulative layer 136. It will be appreciated that this is merely illustrative. For example, the via 138 can be alternatively configured to interconnect a single trace on each side of the PCC; an electrically conductive pad can be formed to surround the via; the non-connected traces can be routed so as to avoid the via, and so on.

Any number of individual traces and other conductive features can be formed on each side of the insulative layer 136. Such features may be localized or may extend the full length of the PCC 130. Discrete components such as multi-pin electrical connectors, integrated circuits, resistors, capacitors, stiffeners, etc. can also be incorporated into the PCC as required.

Figure 3A:
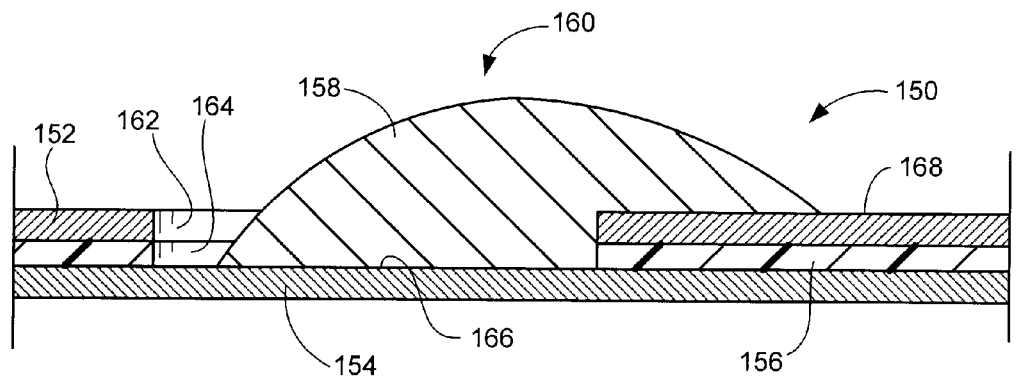
FIG. 3A is a side elevational, cross-sectional representation of a flex circuit with a multi-layer interconnection formed in accordance with various embodiments of the present invention.

FIG. 3A shows an exemplary PCC 150 constructed in accordance with some embodiments of the present invention. As with the PCC 130 in FIG. 2A, the PCC 150 in FIG. 3A has a multi-layer construction with first and second conductive layers 152, 154 on opposing sides of an intervening insulative layer 156. An electrical interconnection 158 is formed through the PCC 150 to interconnect the upper and lower conductive layers 152, 154. The interconnection 158 is formed by creating a cavity 160 (partial or complete aperture) that extends into the PCC 150 through the upper conductive layer 152 and the insulative layer 156. The cavity 160 can be formed using a laser abrasion process to remove material from the respective upper conductive layer 152 and the insulative layer 156. The removal process continues until the lower conductive layer 154 is exposed.

The resulting cavity 160 is defined by a circumferentially extending sidewall 162 in the upper conductive layer 152, a circumferentially extending sidewall 164 in the insulative layer 156, and an exposed undercut surface 166 of the lower conductive layer 154. It is contemplated that the lower conductive layer 154 will fully span the cavity 160 so as to extend across the entirety of the cross-sectional area of the cavity. However, such is not necessarily required, so long as at least a continuous portion (web) of the conductive material spans the aperture to provide a base for the cavity.

The interconnection 158 is formed by reflowing a solder material within the partial or complete aperture to mechanically and electrically interconnect the upper and lower layers 152, 154. For reference, the term "solder" and the like will be broadly understood to describe any number of conductive materials, metals and/or alloys that are reflowed from an initial shape to a final solid state to establish an electrical interconnection path.

In some embodiments, a viscous solder paste (e.g., solder particles in a suspension of flux) is applied to the cavity, heated and then allowed to cool to form the electrical interconnection 158. In other embodiments, a preformed solder ball or brick can be placed into the cavity and reflowed to establish the interconnection 158.

The solder material in FIG. 3A can partially or completely fill the cavity 160 and contact the upper conductive layer 152 on one side of the cavity. Alternatively, the cavity 160 can be completely filled and the solder material can establish contact with the top surface 168 a full 360 degrees around the cavity.

Figure 3B:
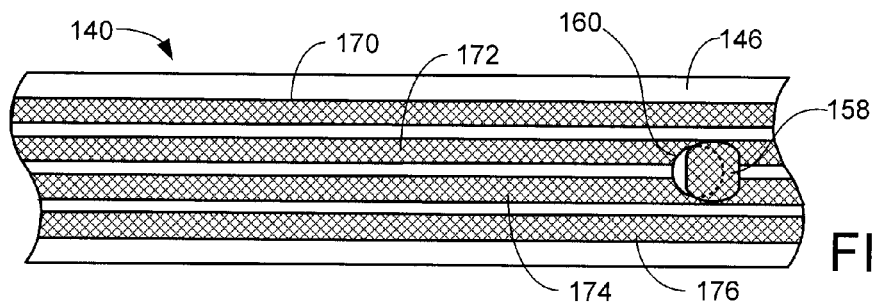
FIG. 3B is a top plan representation of the flex circuit of FIG. 3A.

FIG. 3B is a top plan exemplary representation of the PCC 150 in FIG. 3A. The cavity 160 is shown to have a circular cross-sectional shape, although other shapes can be used such as a rectangular cross-sectional shape. The upper conductive layer 152 is shown to have four (4) adjacent copper traces 170, 172, 174 and 176. The electrical interconnection 158 is used to interconnect the traces 172, 174 to one or more traces on the bottom side of the PCC. As before, a single trace on each side of the PCC 150 can be alternatively interconnected, and a surrounding pad can be formed to further accommodate the electrical interconnection.

Figure 4A:
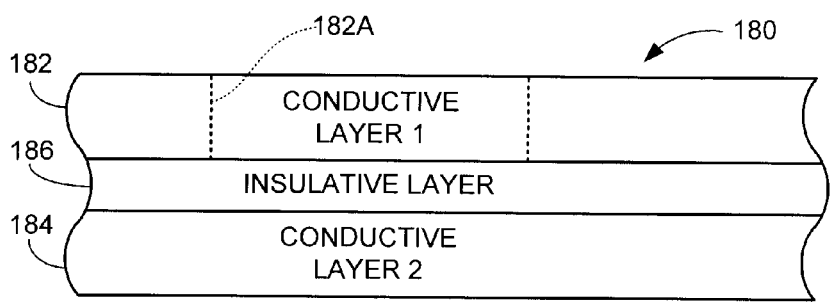
FIG. 4A-4C illustrate an exemplary manufacturing sequence to form a flex circuit with a multi-layer interconnection in accordance with various embodiments.
Figure 4B:
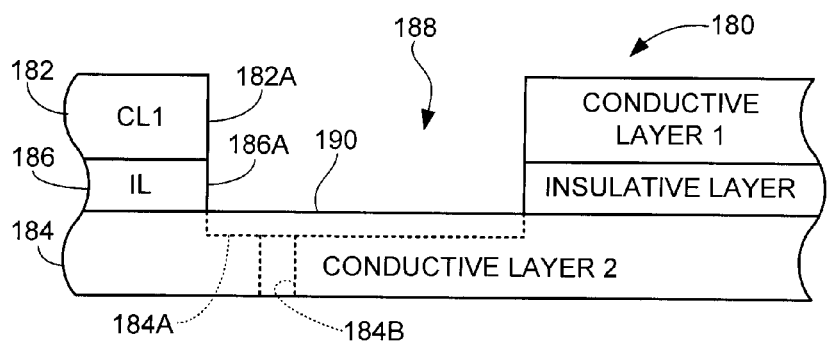
Figure 4C:
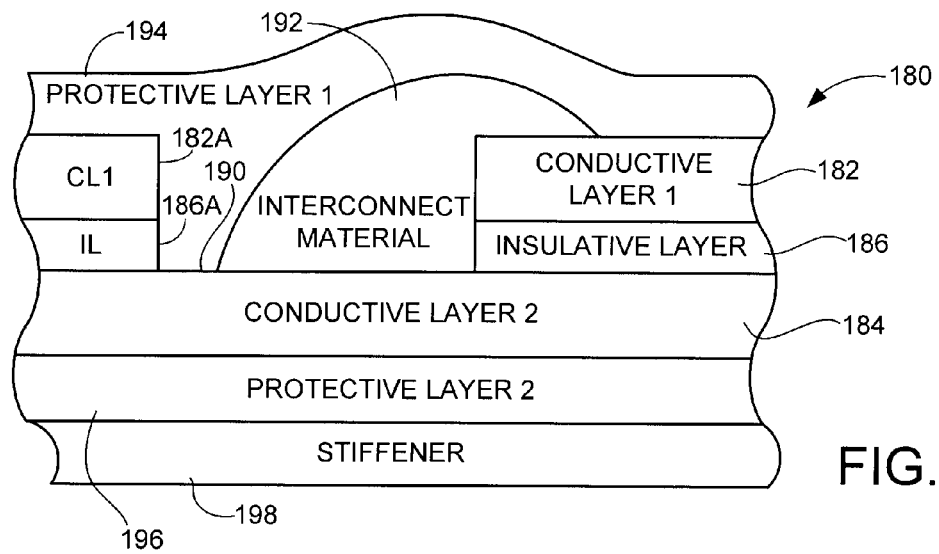

FIGS. 4A-4C illustrate steps that may be taken to form an electrical interconnection as shown in FIGS. 3A-3B. In FIG. 4A, a multi-layer flex circuit (PCC) 180 is provided with two independent conductive layers 182 and 184 formed on opposing sides of an intervening insulative layer 186. It will be noted that the insulative layer 186 has an overall thickness that is significantly less than the respective overall thicknesses of the conductive layers 182, 184. The insulative layer 186 in FIG. 4A is also significantly less than the thickness of the insulative layer 136 shown in FIG. 2A.

A suitable material deposition process may be used to initially form the first and second conductive layers 182, 184 on the insulative layer 186. For example, a copper etching process may be used to form the conductive layers as discrete copper traces on opposing sides of the insulative layer.

FIG. 4B illustrates a partial aperture (cavity) 188 in the PCC 180. The partial aperture 188 extends through the first conductive layer 182 and the insulative layer 186 down to an underlying surface 190 of the second conductive layer 184. The underlying base surface 190 spans the partial aperture 188. While the partial aperture 188 is not limited to a particular process, size, or location, laser abrasion is used in some embodiments to precisely remove the layer(s) of the PCC 180 while leaving the second conductive layer 184 substantially intact so as to span the aperture. The partial aperture 188 is thus defined by the exposed underlying base surface 190 of the second conductive layer 184, a circumferentially extending sidewall 186A in the insulative layer 186, and a circumferentially extending sidewall 182A in the first conductive layer 182.

In some embodiments, the copper (or other deposited conductive material) forming the first conductive layer 182 is provided as a continuous layer on the top surface of the insulative layer 186. In such case, the material removal process can operate to sequentially remove portions of the first conductive layer 182 to form sidewall 182A, and to remove portions of the insulative layer 186 to form sidewall 186A. Some amount of thinning of the second conductive layer 184 may take place during the material removal process, as denoted by dotted line 184A. Localized openings through the second conductive layer 184 may also be formed in some applications, as denoted at 184B, so long as a web of continuous material from the second layer continues to span the partial aperture.

In other embodiments, the first conductive layer 182 is etched or masked to provide the sidewall 182A prior to the use of the laser abrasion process to remove material from the insulative layer 186, as denoted in FIG. 4A. Masking the area eliminates the need to subsequently remove the copper (or other conductive material) from the top surface of the insulative layer 186 to form the partial aperture.

A solder material 192 is subsequently placed into the formed partial aperture 188 and reflowed to provide a final shape as shown in FIG. 4C. The reflowed solder material 192 creates an interconnection that allows signals from both layers 182, 184 to be transmitted together along the length of the PCC 180. This may be useful, for example, when different conductive layers are maintained at a common reference voltage (e.g., ground, +5VDC, etc.). High frequency signals may be alternatively transmitted along the interconnected layers 182, 184, and the interconnection serves to reduce the effects of impedance mismatches between the respective layers.

In some embodiments, the interconnect material 192 constitutes a solder paste or brick which is reflowed using a suitable solder reflow process. Any suitable process that heats the material causing it to melt, and then allows the material to subsequently cool and harden can be used. Examples include but are not limited to a wave solder machine, an infrared heater, a forced hot air conduction system, an oven, a soldering iron, etc. Other solder connections on the PCC can be concurrently formed at this time.

The relatively large contact areas for the connection material 192 on the exposed surface 190 of the second conductive layer 184 and a top surface of the first conductive layer 182 enhances the integrity of the electrical and mechanical interconnections between the first and second conductive layers, and provides ample conductive pathways between the layers to accommodate a wide range of signal types and signal strengths.

FIG. 4C further shows a number of additional layers that can be subsequently added to the PCC, such as first and second protective layers 194 and 196, and a stiffener 198. The protective layers can comprise thin film electrically insulative material to protect and isolate the conductive layers and the interconnection material. The stiffener can comprise a thin sheet of aluminum or other rigid material to provide localized stiffening support to the PCC.

Figure 5:
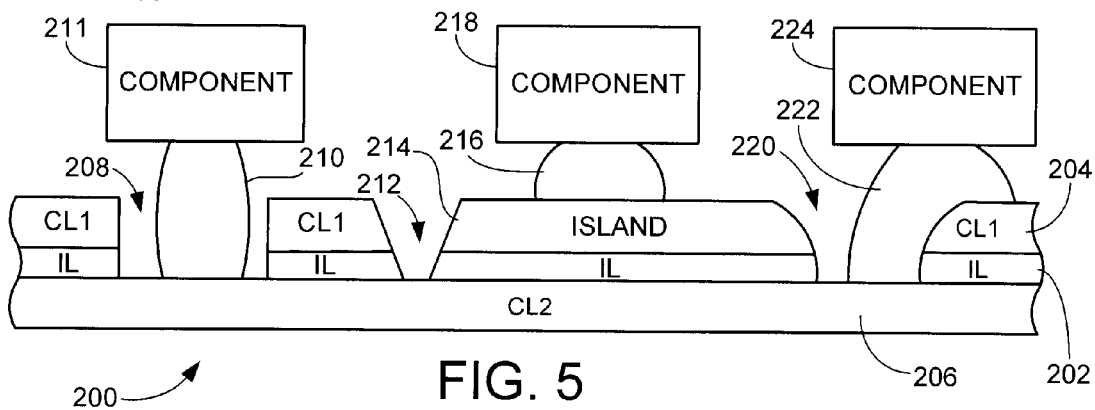
FIG. 5 shows another exemplary configuration for a flex circuit with a multi-layer interconnection.

FIG. 5 provides another exemplary PCC 200 formed in accordance with various embodiments to show additional exemplary features that can be incorporated as desired. The PCC 200 has an insulative layer 202 that is disposed between first and second conductive layers 204, 206. A first partial aperture (cavity) 208 is shown with vertically extending sidewalls and accommodates an interconnection material 210 to interconnect the second conductive layer 206 with a component 211 in accordance with various embodiments of the present invention.

A second partial aperture 212 is formed in the PCC 200 with tapered sidewalls that extend down to the second conductive layer 206. The tapered sidewalls can be formed by a laser abrasion process, or a by a different process. Solder material can be used to establish an interconnection in the second partial aperture 212 between the layers 204, 206. Alternatively, the second partial aperture 212 can be left unfilled to form a localized island portion 214 that is electrically isolated from remaining portions of the upper conductive layer 204. A solder ball 216 can be used to interconnect the island portion 214 to a first component 218 as shown. The solder ball 216 can be reflowed by the same process used to reflow the solder interconnect 210.

A third partial aperture 220 is formed in the PCC 220 with curvilinearly extending sidewalls. The third partial aperture 220 is partially filled with solder interconnecting material 222 to interconnect the upper and lower conductive layers 204, 206 with a second component 224.

Figure 6:
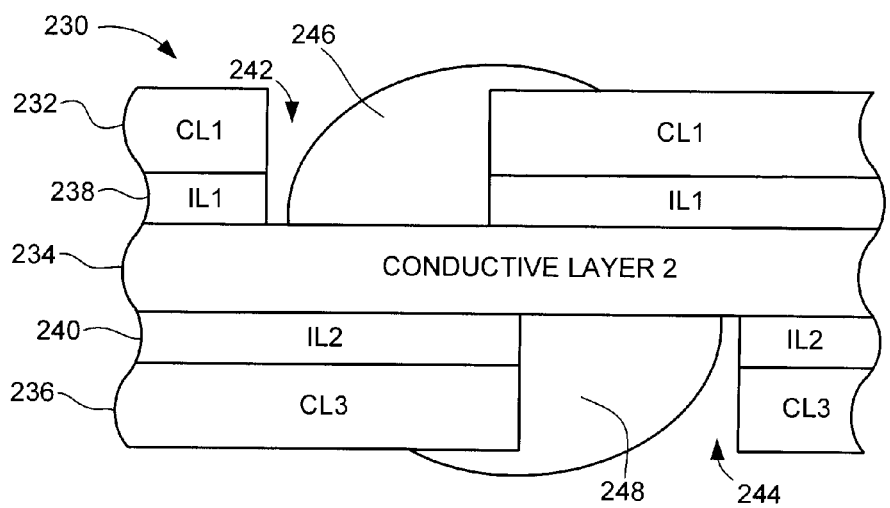
FIG. 6 provides an alternative configuration for a flex circuit with multiple multi-layer interconnections.

FIG. 6 provides a PCC 230 with first, second and third conductive layers 232, 234 and 236 separated by first and second insulative layers 238 and 240. Opposing cavities 242, 244 are formed on each side of the intermediate conductive layer 234 to accommodate respective solder interconnections 246, 248. While the interconnections are shown to be laterally offset, the interconnections could be axially aligned. As before, additional interconnections and additional layers can be applied to the PCC 230 as desired.

Figure 7:
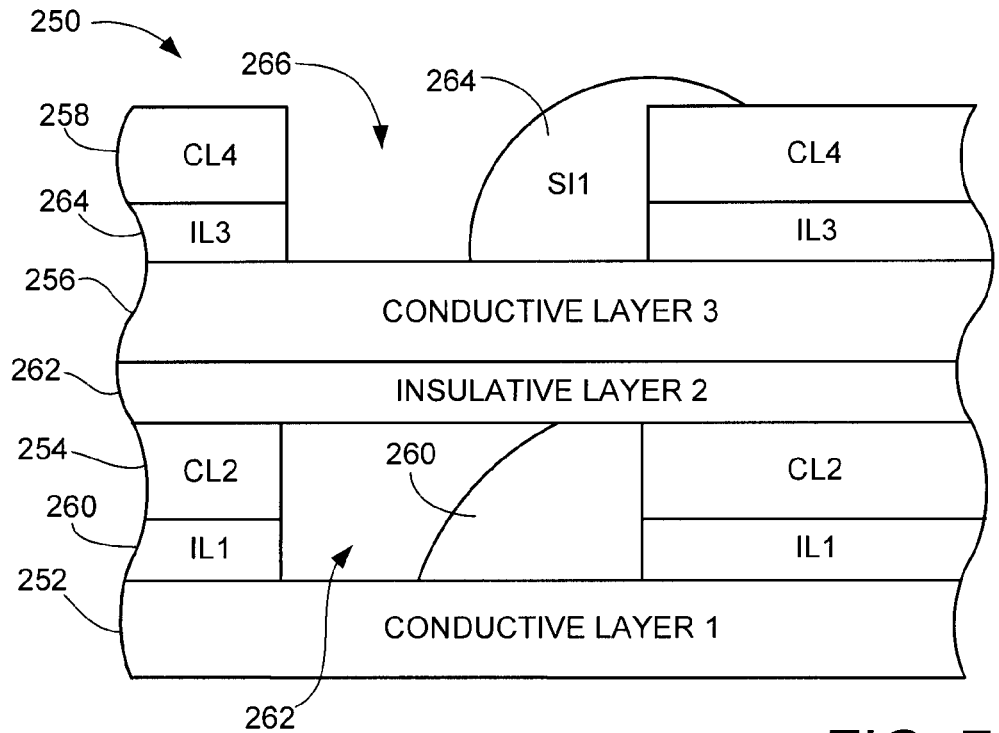
FIG. 7 illustrates another alternative configuration for a flex circuit with multiple multi-layer interconnections.

FIG. 7 generally illustrates an exemplary PCC 250 that has four conductive layers 252, 254, 256 and 258 and three intervening insulating layers 260, 262 and 264. The first conductive layer 252 can be electrically and mechanically interconnected to the second conductive layer 254 with a first connecting material 260 that partially fills a cavity 262. Similarly, a second connecting material 264 interconnects the third and fourth conductive layers 256, 258 in a second cavity 266. The PCC 250 in FIG. 7 is shown to be constructed in such a manner that the first cavity 262 is recessed (buried) within the interior of the PCC 250.

It should be noted that in various embodiments, the connecting material 260 is applied after the first cavity 262, which can be facilitated in a variety of different ways. One such way is the injection of the connecting material 260 into cavity 260 with a precise instrument, such as a syringe. While the various methods of applying the connecting material 260 is not limited, the PCC 250 can be constructed in various ways to accommodate the subsequent electrical connection of the first and second conductive layers 252 and 254.

Figure 8:
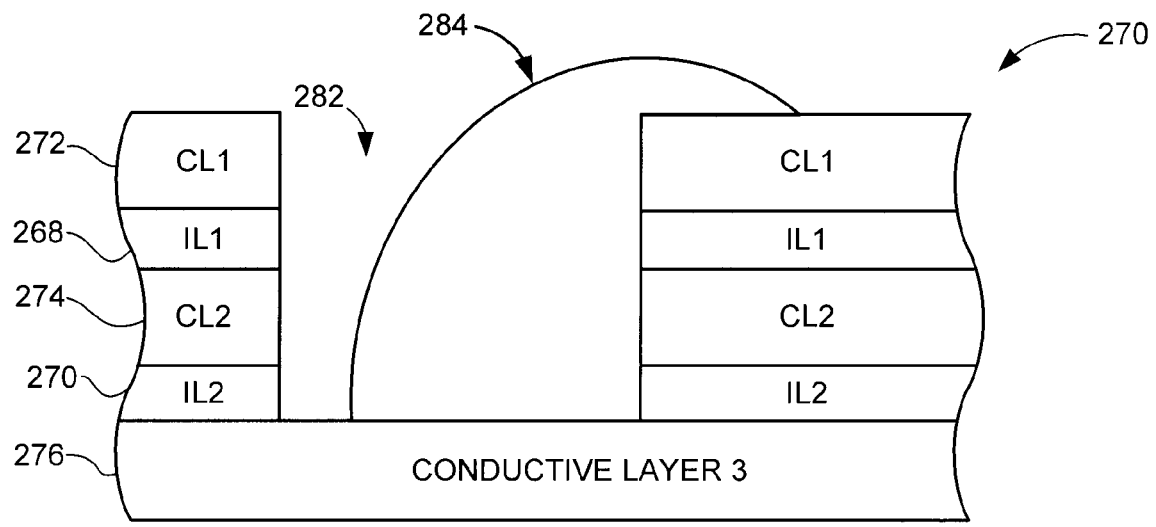
FIG. 8 shows yet another alternative configuration for a flex circuit with a multi-layer interconnection.

FIG. 8 shows yet another exemplary PCC 270 constructed in accordance with various embodiments. The PCC 270 has a first, second, and third independent conductive layers 272, 274, and 276 separated by first and second insulative layers 278 and 280, respectively. Interconnection of the three conductive layers can be undertaken by forming a cavity 282 that extends down to the third conductive layer 276, and applying an interconnection material 284 as shown.

Figure 9:
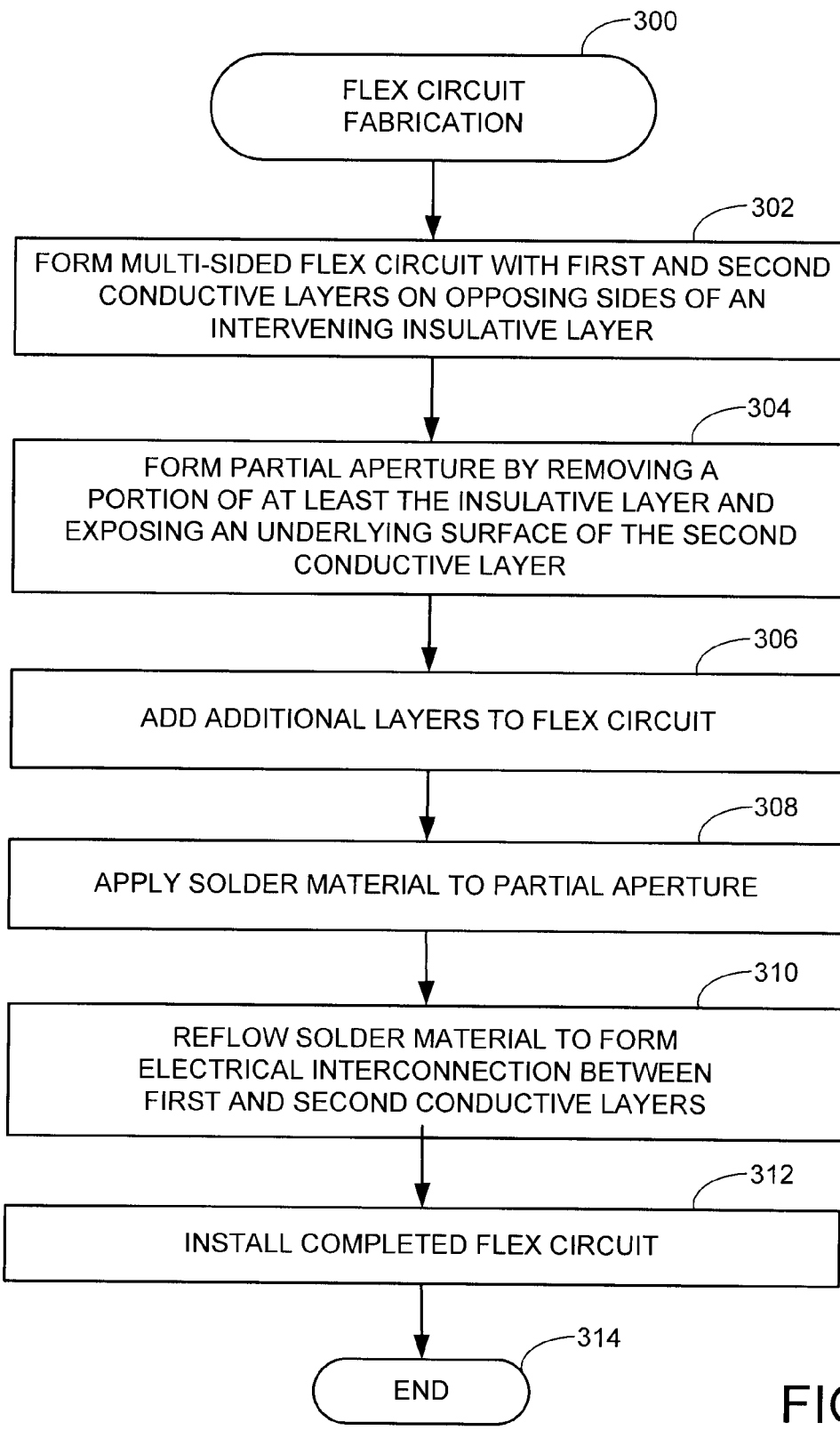
FIG. 9 provides a FLEX CIRCUIT FABRICATION routine illustrative of steps carried out in accordance with various embodiments of the present invention.

FIG. 9 provides a flow chart for a FLEX CIRCUIT FABRICATION routine 300 to summarize various steps discussed above. The routine begins at step 302 by forming a multi-sided flexible PCC with conductive layers on opposing sides of an intermediary insulative layer. Suitable masking, metallization and etching processes can be applied to form the respective conductive layers. In some embodiments, the layers comprise elongated electrically conductive traces formed of copper or other suitable conductive material with thicknesses significantly greater than the thickness of the insulative layer. The first conductive layer can be masked or etched during this step so that the top surface of the insulative layer is exposed in the vicinity of the desired electrical interconnection(s).

To form each electrical interconnection between the conductive layers, at step 304 an associated partial aperture (cavity) is formed at each location that extends through the first layer and the insulative layer to expose an underlying surface of the second conductive layer. This can be carried out by laser abrasion of the insulative layer to uncover the second conductive layer as discussed above.

Additional layers are added to the flex circuit such as shown in FIG. 4C at step 306, such as the protective layers 194, 196 and stiffener 198 illustrated in FIG. 4C. A solder material is placed into the partial aperture at step 308. The solder material may comprise solder paste, one or more solder bricks or other pre-forms, solder wire, etc.

The solder material is reflowed at step 310 to form the desired interconnection between the conductive layers. Other desired interconnections on the PCC can be formed concurrently during this step, such as additional inter-layer interconnections or attachment of discrete components to the flex circuit. The completed flex circuit is installed at step 312 in a suitable environment such as the data storage device 100 in FIG. 1. The process then ends at 314.

The various embodiments discussed herein can provide beneficial electrical interconnection and flexible printed circuit cable constructions. Because vias such as illustrated in FIGS. 2A-2B are not necessary to establish the interconnections, the intervening insulative layer can be provided with a reduced thickness, improving impedance matching characteristics of the completed PCC. It will be appreciated, however, that the interconnection methodologies disclosed herein can be used in flex circuits that also incorporate the use of vias in other locations, as desired. The various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
   providing a multi-sided flex circuit with a first conductive layer on a first side of a flexible insulative layer and a second conductive layer on an opposing second side of the insulative layer;
   forming a partial aperture in the flex circuit by removing a portion of the insulative and first conductive layers to expose a portion of the second conductive layer that spans said aperture;
   placing a solder material in the partial aperture; and
   electrically interconnecting the first and second conductive layers by reflowing said solder material to fill less than an entirety of the partial aperture.

2. The method of claim 1, wherein the flex circuit further comprises a second flexible insulative layer between the second conductive layer and a third conductive layer, wherein a second electrical interconnection is formed between the second and third conductive layers by repeating the forming, placing and electrically interconnecting steps for said second and third conductive layers, the forming step reducing the second conductive layer from the second thickness to a third thickness.

3. The method of claim 1, wherein the providing step comprises using a metal deposition process to deposit conductive material on opposing sides of the insulative layer, and an etching process to remove portions of the deposited conductive material to form at least one electrically conductive trace on each side of the insulative layer, wherein the reflowed solder material interconnects said traces.

4. The method of claim 1, wherein the partial aperture is formed during the forming step by a laser abrasion process which selectively removes portions of the insulative layer to expose the underlying surface of the second conductive layer.

5. The method of claim 1, wherein the reflowed solder material contacts said exposed portion of the second conductive layer and a top surface of the first conductive layer opposite the insulative layer.

6. The method of claim 1, wherein the solder material only partially fills the partial aperture and only extends partially around the circumference of the partial aperture.

7. The method of claim 1, wherein the partial aperture has a circular cross-sectional shape.

8. The method of claim 1, wherein the partial aperture reduces the second conductive layer from a first thickness to a second thickness.

9. The method of claim 1, wherein after reflowing said solder material, a portion of the second conductive layer remains exposed.

10. The method of claim 9, wherein the remaining exposed portion of the second conductive layer is defined by a gap between a sidewall of the partial aperture and said reflowed solder material.

11. The method of claim 1, wherein the reflowed solder material contacts less than an entirety of the exposed portion of the second conductive layer.

12. The method of claim 1, wherein the reflowed solder material continuously extends beyond the partial aperture to contact a top surface of the first conductive layer.

* * * * *